(12) United States Patent
Moriya et al.

(10) Patent No.: US 8,809,922 B2
(45) Date of Patent: Aug. 19, 2014

(54) SOLID-STATE IMAGE SENSING DEVICE AND ELECTRONIC APPARATUS

(75) Inventors: Hitoshi Moriya, Kanagawa (JP); Hiroaki Ishiwata, Tokyo (JP); Kazuyoshi Yamashita, Kanagawa (JP); Hiroyuki Mori, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/592,538

(22) Filed: Aug. 23, 2012

(65) Prior Publication Data

US 2013/0049081 A1    Feb. 28, 2013

(30) Foreign Application Priority Data

Aug. 31, 2011   (JP) .................................. 2011-188994

(51) Int. Cl.
*H01L 31/062* (2012.01)

(52) U.S. Cl.
USPC ..... 257/291; 257/292; 257/297; 257/E31.083

(58) Field of Classification Search
USPC .................................................. 257/E31.115
See application file for complete search history.

(56) References Cited

FOREIGN PATENT DOCUMENTS

| JP | 200878302 | * | 3/2008 |
| JP | 2008-078302 | | 4/2008 |

* cited by examiner

*Primary Examiner* — Yasser A Abdelaziez
(74) *Attorney, Agent, or Firm* — Sheridan Ross P.C.

(57) ABSTRACT

Disclosed is a solid-state image sensing device including: a first photoelectric conversion element having a first semiconductor region of a first conductivity type formed inside a semiconductor substrate; a second photoelectric conversion element having a second semiconductor region of a first conductivity type formed at a deeper position of the semiconductor substrate than the first photoelectric conversion element; a gate electrode laminated on the semiconductor substrate and to which a predetermined voltage is applied at a charge transfer time; a floating diffusion region to which the charges accumulated in the first photoelectric conversion element and the second photoelectric conversion element are transferred at the charge transfer time; and a third semiconductor region of a first conductivity type arranged between the first semiconductor region and the second semiconductor region in a depth direction of the semiconductor.

9 Claims, 4 Drawing Sheets

SOLID-STATE IMAGE SENSING DEVICE AND ELECTRONIC APPARATUS

BACKGROUND

The present disclosure relates to a solid-state image sensing device and an electronic apparatus, and in particular, to a solid-state image sensing device and an electronic apparatus that are capable of obtaining more excellent image quality.

In general, solid-state image sensing devices such as CMOS (Complementary Metal Oxide Semiconductor) image sensors and CCD (Charge Coupled Device) image sensors have been widely used in digital still cameras, digital video cameras, or the like. For example, incident light incident on a CMOS image sensor is photoelectrically converted by a PD (Photodiode) serving as a photoelectric conversion part of a pixel. Then, charges generated by the PD are transferred to a FD (Floating Diffusion) serving as a floating diffusion region via a transfer transistor, and an amplification transistor outputs a pixel signal at a level corresponding to the charges accumulated in the FD.

In the related art, in a solid-state image sensing device, there have been proposed technologies for forming a PD at a deep position distant from the front surface of a silicon substrate in order to achieve a minute pixel size and increase a saturation charge amount.

For example, Japanese Patent Laid-open No. 2008-78302 discloses a solid-state image sensing device with a PNPNP structure where a HAD (Hole Accumulated Diode) has two charge accumulation parts. In the solid-state image sensing device, an impurity concentration distribution is graded by ion-implantation, and charges are transferred to a FD via under a transfer gate.

SUMMARY

However, in a case where a PD is formed at a deep position of a silicon substrate as in an image sensing apparatus disclosed in Japanese Patent Laid-open No. 2008-78302, there is a difficulty in transferring charges accumulated in the PD. In other words, because there is a P-type region for separation adjacent to the lower part of a FD and an N-type region at a deeper position of the PD is formed so as to have a uniform concentration, the charges accumulated at the deep position are hard to be transferred. Because of this, if there is a failure in transferring the charges from the PD, non-transferred charges result in an after-image and image quality is degraded.

The present disclosure has been made in view of the above circumstances, and it is therefore desirable to obtain more excellent image quality.

According to an embodiment of the present disclosure, there is provided a solid-state image sensing device including a first photoelectric conversion element, a second photoelectric conversion element, a gate electrode, a floating diffusion region, and a third semiconductor region. The first photoelectric conversion element has a first semiconductor region of a first conductivity type formed inside a semiconductor substrate. The second photoelectric conversion element has a second semiconductor region of a first conductivity type formed at a deeper position of the semiconductor substrate than the first photoelectric conversion element. The gate electrode is laminated on the semiconductor substrate. To the gate electrode, a predetermined voltage is applied at a charge transfer time at which a signal corresponding to charges photoelectrically converted by the first photoelectric conversion element and the second photoelectric conversion element is read. To the floating diffusion region, the charges accumulated in the first photoelectric conversion element and the second photoelectric conversion element are transferred at the charge transfer time. The third semiconductor region of a first conductivity type is arranged between the first semiconductor region and the second semiconductor region in a depth direction of the semiconductor substrate so as to be overlapped with the gate electrode when seen in a plan view.

According to another embodiment of the present disclosure, there is provided an electronic apparatus including a solid-state image sensing device. The solid-state image sensing device has a first photoelectric conversion element, a second photoelectric conversion element, a gate electrode, a floating diffusion region, and a third semiconductor region. The first photoelectric conversion element has a first semiconductor region of a first conductivity type formed inside a semiconductor substrate. The second photoelectric conversion element has a second semiconductor region of a first conductivity type formed at a deeper position of the semiconductor substrate than the first photoelectric conversion element. The gate electrode is laminated on the semiconductor substrate. To the gate electrode, a predetermined voltage is applied at a charge transfer time at which a signal corresponding to charges photoelectrically converted by the first photoelectric conversion element and the second photoelectric conversion element is read. To the floating diffusion region, the charges accumulated in the first photoelectric conversion element and the second photoelectric conversion element are transferred at the charge transfer time. The third semiconductor region of a first conductivity type is arranged between the first semiconductor region and the second semiconductor region in a depth direction of the semiconductor substrate so as to be overlapped with the gate electrode when seen in a plan view.

In an embodiment of the present disclosure, charges are transferred from the second semiconductor region to the first semiconductor region at the charge transfer time via the third semiconductor region of the first conductivity type arranged between the first semiconductor region and the second semiconductor region in the depth direction of the semiconductor substrate so as to be overlapped with the gate electrode when seen in a plan view.

According to an embodiment of the present disclosure, it is possible to obtain more excellent image quality.

These and other objects, features and advantages of the present disclosure will become more apparent in light of the following detailed description of best mode embodiments thereof, as illustrated in the accompanying drawings.

DETAILED DESCRIPTION OF EMBODIMENT

Hereinafter, a specific embodiment to which the present disclosure is applied will be described in detail with reference to the drawings.

Figure 1:
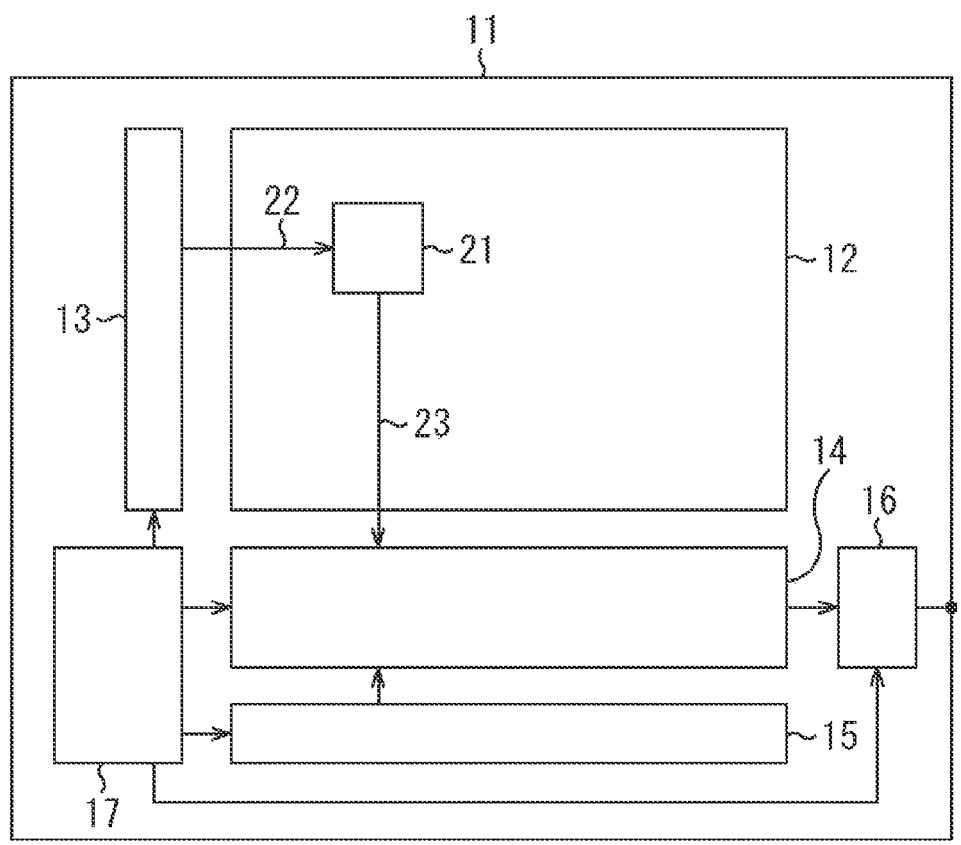
FIG. 1 is a block diagram showing a configuration example according to an embodiment of a solid-state image sensing device to which the present disclosure is applied.

FIG. 1 is a block diagram showing a configuration example according to an embodiment of a solid-state image sensing device to which the present disclosure is applied.

In FIG. 1, the solid-state image sensing device 11 is a CMOS solid-state image sensing device and has a pixel array part 12, a vertical driving part 13, a column processing part 14, a horizontal driving part 15, an output part 16, and a drive controlling part 17.

The pixel array part 12 has a plurality of pixels 21 arranged in array form. The pixels 21 are connected to the vertical driving part 13 via a plurality of horizontal signal lines 22 corresponding to the number of the rows of the pixels 21 and connected to the column processing part 14 via a plurality of vertical signal lines 23 corresponding to the number of the columns of the pixels 21. In other words, the plurality of pixels 21 of the pixel array part 12 are arranged at the points where the horizontal signal lines 22 and the vertical signal lines 23 intersect each other.

The vertical driving part 13 successively supplies, via corresponding one of the horizontal signal lines 22, a driving signal (such as a transfer signal, a selection signal, and a reset signal) for driving each of the pixels 21 for each of the rows of the plurality of pixels 21 of the pixel array part 12.

The column processing part 14 applies, via corresponding one of the vertical signal lines 23, CDS (Correlated Double Sampling) processing to a pixel signal output from each of the pixels 21 to extract the signal level of the pixel signal, and acquires pixel data corresponding to a light receiving amount of each of the pixels 21.

The horizontal driving part 15 successively supplies, to the column processing part 14, a driving signal for outputting the pixel data acquired from each of the pixels 21 from the column processing part 14 for each of the columns of the plurality of pixels 21 of the pixel array part 12.

The output part 16 receives the pixel data from the column processing part 14 at a timing based on the driving signal of the horizontal driving part 15. For example, the output part 16 amplifies the pixel data and outputs the resulting pixel data to a subsequent-stage image processing circuit.

The drive controlling part 17 controls driving of each of the blocks inside the solid-state image sensing device 11. For example, the drive controlling part 17 generates a clock signal according to a driving cycle of each of the blocks and supplies the resulting clock signal to each of the blocks.

Figure 2:
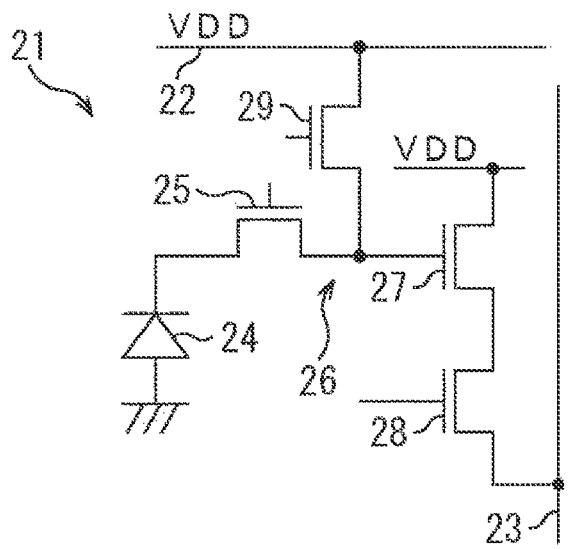
FIG. 2 is a circuit diagram showing a configuration example of a pixel.

FIG. 2 is a circuit diagram showing a configuration example of the pixel 21.

As shown in FIG. 2, the pixel 21 has a PD 24, a transfer transistor 25, a FD 26, an amplification transistor 27, a selection transistor 28, and a reset transistor 29.

Figure 4:
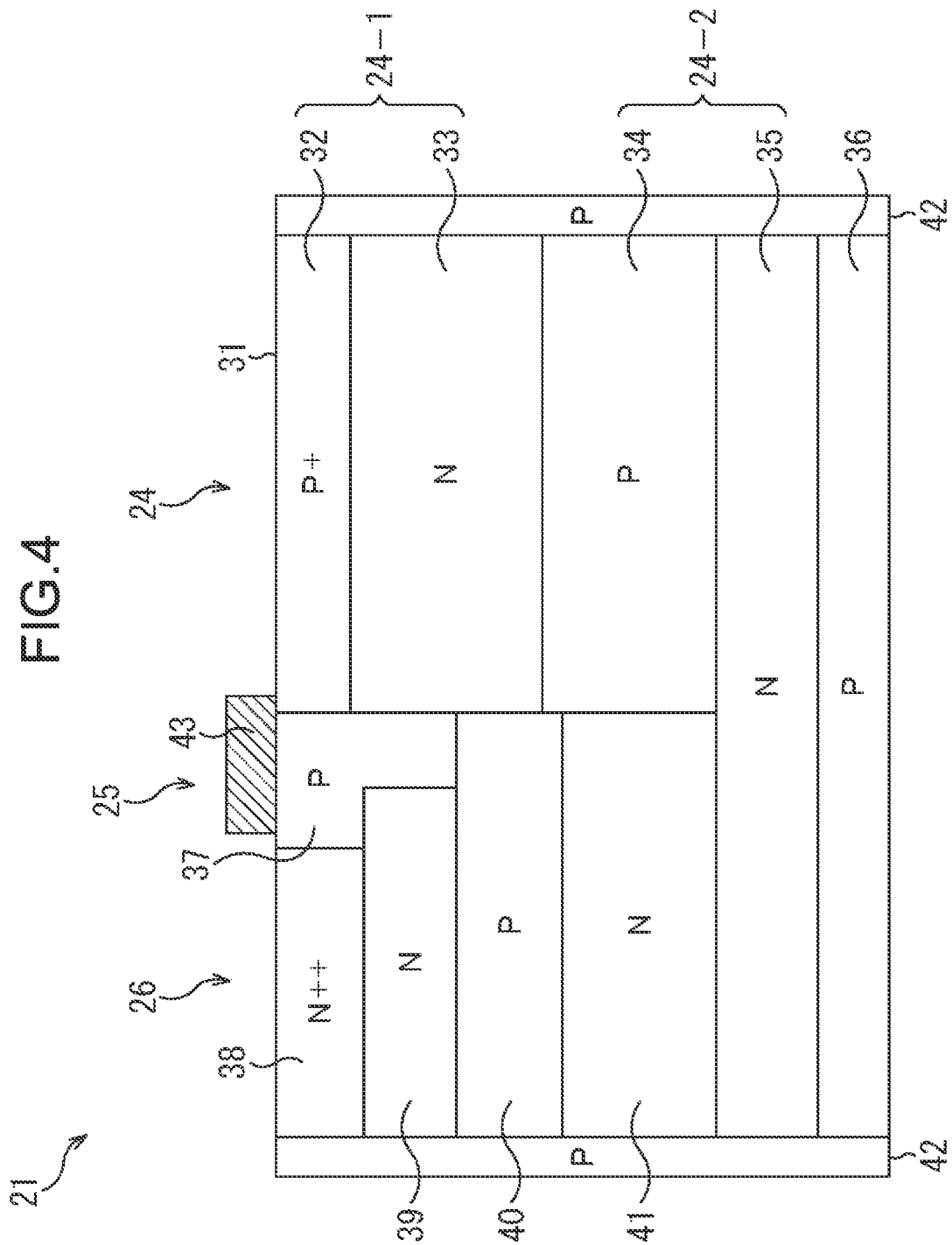
FIG. 4 is a view schematically showing a configuration example of a cross section of the pixel.

As shown in FIG. 4 as will be described below, the PD 24 has P-type regions and N-type regions formed so as to be joined to each other in a silicon substrate. Further, the PD 24 receives light irradiated on the pixel 21 and generates and accumulates charges corresponding to an amount of the light.

The transfer transistor 25 is driven according to a transfer signal supplied from the vertical driving part 13. When the transfer transistor 25 is turned on, the charges accumulated in the PD 24 are transferred to the FD 26.

The FD 26 is a floating diffusion region having predetermined capacity formed at the connected point between the transfer transistor 25 and the gate electrode of the amplification transistor 27. The FD 26 accumulates the charges to be transferred from the PD 24 via the transfer transistor 25.

The amplification transistor 27 is connected to a power supply VDD and outputs a pixel signal at a level corresponding to the charges accumulated in the FD 26.

The selection transistor 28 is driven according to a selection signal supplied from the vertical driving part 13. When the selection transistor 28 is turned on, a pixel signal output from the amplification transistor 27 is read by the vertical signal line 23 via the selection transistor 28.

The reset transistor 29 is driven according to a reset signal supplied from the vertical driving part 13. When the reset transistor 29 is turned on, the charges accumulated in the FD 26 are discharged to the power supply VDD via the reset transistor 29 to reset the FD 26.

Figure 3:
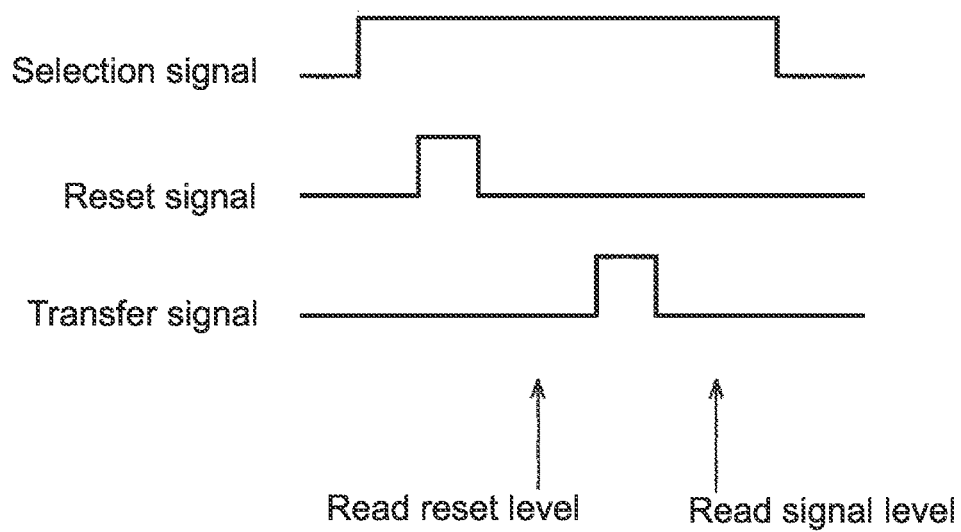
FIG. 3 is a diagram showing an example of timing for driving the pixel.

FIG. 3 is a diagram showing an example of timing for driving the pixel 21.

At the timing at which a reading period for reading a pixel signal from the pixel 21 starts, the vertical driving part 13 sets a selection signal high. Thus, the selection transistor 28 is turned on, thereby creating a state where the signal of the pixel 21 is enabled to be output to the horizontal driving circuit 15 via the vertical signal line 23.

After that, when the vertical driving part 13 sets a reset signal high, the reset transistor 29 is turned on and charges accumulated in the FD 26 are discharged to the power supply VDD. After the resetting is completed as the vertical driving part 13 sets the reset signal low, a pixel signal at the reset level is read.

Next, when the vertical driving part 13 sets a transfer signal high, the transfer transistor 25 is turned on and charges accumulated in the PD 24 are transferred to the FD 26. Then, after the transfer of the charges is completed as the vertical driving part 13 sets the transfer signal low, a pixel signal corresponding to the level of the charges accumulated in the FD 26 is read.

Thus, in the solid-state image sensing device 11, the pixel signal at the reset level and the pixel signal corresponding to the level of the charges accumulated in the FD 26 are read, and the column processing part 14 extracts the signal level of the pixel signal.

FIG. 4 is a view schematically showing a configuration example of a cross section of the pixel 21.

As shown in FIG. 4, the PD 24 of the pixel 21 has a PD 24-1 arranged at a shallow position of a silicon substrate 31 and a PD 24-2 arranged at a deep position thereof.

The PD 24-1 has a P-type region 32 formed so as to be joined to the upper surface (surface facing an upper side in FIG. 4) of the silicon substrate 31 and an N-type region 33 formed at a deep position of the silicon substrate 31 so as to be joined to the P-type region 32. Further, the PD 24-2 has a P-type region 34 formed at a deeper position of the silicon substrate 31 than the N-type region 33 and an N-type region 35 formed at a deep position of the silicon substrate 31 so as to be joined to the P-type region 34.

Moreover, a P-type region 36 is formed at a deep position of the silicon substrate 31 under the N-type region 35 so as to be joined to the N-type region 35. Further, the P-type region 36 is formed so as to have a lower impurity concentration than the P-type regions 32 and 34.

As described above, the PD 24 has so-called a PNPNP structure where the P-type region 32, the N-type region 33, the P-type region 34, the N-type region 35, and the P-type region 36 are successively laminated one on another from the side of the upper surface of the silicon substrate 31.

Further, the N-type region 35 and the P-type region 36 are formed in the whole area of the pixel 21, while the P-type region 32, the N-type region 33, and the P-type region 34 are formed in part (about a right half in FIG. 4) of the pixel 21. Further, in the other area (about a left half in FIG. 4) of the PD 24 at the depth where the P-type region 32, the N-type region 33, and the P-type region 34 are formed, a P-type region 37, an N-type region 38, an N-type region 39, a P-type region 40, and an N-type region 41 are formed.

Further, for electrical separation of the pixel 21 from adjacent pixels, a P-type region 42 is formed so as to surround the pixel 21. Note that besides formation of the P-type region 42, technologies such as STI (Shallow Trench Isolation) and LOCOS (Local Oxidation of Silicon) may be used to perform pixel separation.

Moreover, a gate electrode 43 of the transfer transistor 25 is formed so as to be laminated on the upper surface of the silicon substrate 31 at a position corresponding to the P-type region 37. That is, with application of a predetermined voltage to the gate electrode 43, charges accumulated in the PDs 24-1 and 24-2 are transferred to the FD 26 via the transfer transistor 25.

The P-type region 37 is formed at a position adjacent to the P-type region 32 so as to come in contact with the upper surface of the silicon substrate 31.

The N-type region 38 is formed at a position distant from the P-type region 32 via the P-type region 37 so as to come in contact with the upper surface of the silicon substrate 31, and functions as the FD 26. In addition, the N-type region 38 is a region (N++) having the highest N-type impurity concentration in the pixel 21.

The N-type region 39 is formed at a deeper position than the N-type region 38 so as to be joined to the N-type region 38. In addition, the N-type region 39 is formed so as to be more projected in the direction of the P-type region 37 than the N-type region 38. In other words, the N-type region 39 is formed so as to get in the lower side of the P-type region 37 such that the interval between the N-type regions 39 and 33 becomes smaller than that between the N-type regions 38 and 33.

Because the N-type region 39 is thus formed, potential below the gate electrode 43 may be improved and the charges accumulated in the N-type region 33 are easily transferred to the N-type region 38 via the N-type region 39 at a charge transfer time. In other words, the N-type region 39 functions as an assisting region for transferring the charges from the N-type region 33 to the N-type region 38. Thus, the PD 24 is allowed to reduce a failure in transferring the charges and improve its transfer characteristics.

The P-type region 40 is formed at a deeper position than the N-type region 39 and the P-type region 37.

The N-type region 41 is a region sandwiched between the P-type region 40 and the N-type region 35 and formed at a deeper position than the N-type region 33. That is, the N-type region 41 is formed between the N-type regions 33 and 35 in the depth direction of the silicon substrate 31. In addition, the N-type region 41 is formed below the FD 26 and the gate electrode 43 so as to be overlapped with the FD 26 and the gate electrode 43 when seen in a plan view.

Because the N-type region 41 is thus formed, the charges accumulated in the N-type region 35 are easily transferred to the N-type region 33 via the N-type region 41 at the charge transfer time. In other words, the N-type region 41 functions as an assisting region for transferring the charges from the N-type region 35 to the N-type region 33. Thus, the PD 24 is allowed to reduce a failure in transferring the charges and improve its transfer characteristics.

The pixel 21 is thus configured. As for the concentration gradient of the N-type regions 33 and 35 serving as charge retaining parts and the N-type region 41 formed between the N-type regions 33 and 35, the N-type region 33, the N-type region 41, and the N-type region 35 are arranged in this order in terms of a higher concentration. More specifically, the N-type region 35 has a concentration of up to about $10^{15}$ $cm^{-3}$, the N-type region 41 has a concentration of up to about $10^{16}$ $cm^{-3}$, and the N-type region 33 has a concentration of up to about $10^{15}$ $cm^{-3}$. That is, the N-type region 35 is formed so as to have a lower impurity concentration than the N-type region 33.

Further, in the depth direction of the N-type regions 33, 41, and 35, the N-type region 33 is arranged at a depth between 0.1 μm and 0.2 μm, the N-type region 35 is arranged at a depth between 0.3 μm and 0.5 μm, and the N-type region 41 is arranged between the N-type regions 33 and 35.

Further, because the N-type regions 39 and 41 function as the assisting regions for transferring the charges as described above, the PD 24 is allowed to reduce degradation in charge transfer characteristics.

As described above, because the concentration gradient and the arrangement of the N-type regions are properly performed in the pixel 21, the number of saturation electrons is increased and the charges accumulated in the PD 24-2 may be completely transferred to the PD 24-1 when the charges are transferred from the PD 24-2 to the PD 24-1. Accordingly, with an improvement in charge transfer characteristics, it is possible to further reduce a failure in transferring the charges, prevent the occurrence of an after-image caused by non-transferred charges, and obtain more excellent image quality than before. In addition, with formation of the N-type region 35 in the whole area at the deep position of the silicon substrate 31, it is possible to increase the number of saturation electrons.

Further, in order to read charges accumulated at a deep position of a silicon substrate, a vertical gate electrode is, for example, employed. However, because the silicon substrate is etched and excavated to form a vertical gate, there is a concern about giving an impact on the silicon substrate due to plasma. Accordingly, degradation in pixel characteristics such as white spots and a dark current is assumed.

On the other hand, in the pixel 21, it is possible to efficiently read the charges from the N-type region 35 formed at the deep position of the silicon substrate 31 without using such a vertical gate electrode. Therefore, a problem assumed with the use of a vertical gate does not occur.

Figure 5:
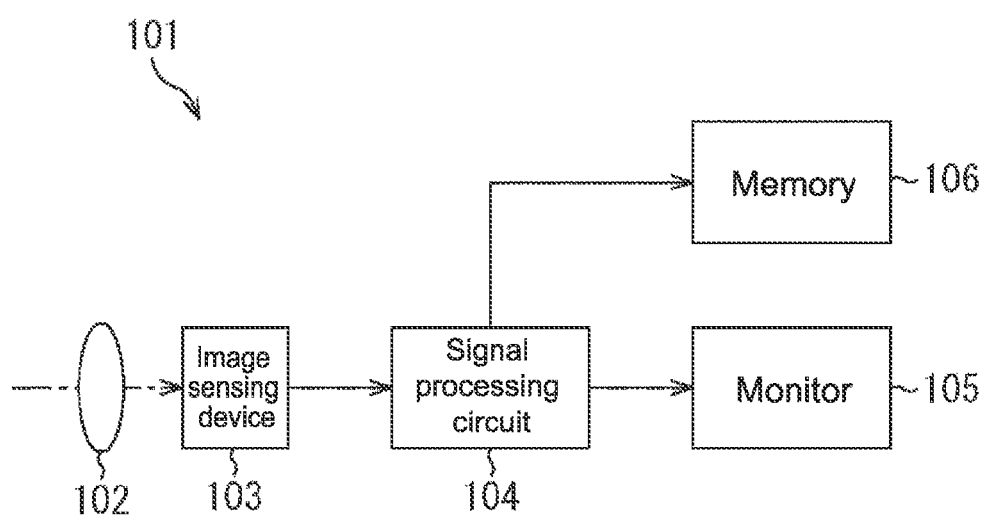
FIG. 5 is a block diagram showing a configuration example of an image sensing apparatus installed in an electronic apparatus.

FIG. 5 is a block diagram showing a configuration example of an image sensing apparatus installed in an electronic apparatus.

As shown in FIG. 5, the image sensing apparatus 101 has an optical system 102, an image sensing device 103, a signal processing circuit 104, a monitor 105, and a memory 106 and is capable of picking up still images and moving images.

The optical system 102 has one or a plurality of lenses, guides image light (incident light) from a subject into the image sensing device 103, and forms an image on the light receiving surface (sensor part) of the image sensing device 103.

As the image sensing device 103, the solid-state image sensing device 11 having the pixels 21 configured as described above is applied. In the image sensing device 103, electrons are accumulated for a certain period of time according to an image formed on the light receiving surface via the optical system 102. Then, a signal according to the electrons accumulated in the image sensing device 103 is supplied to the signal processing circuit 104.

The signal processing circuit 104 applies various signal processing to signal charges output from the image sensing device 103. An image (image data) obtained when the signal processing circuit 104 applies the signal processing to the signal charges is supplied to and displayed on the monitor 105 or supplied to and stored (recorded) in the memory 106.

In the image sensing apparatus 101 thus configured, it is possible to obtain more excellent image quality with application of the solid-state image sensing device 11 having the pixels 21 configured as described above as the image sensing device 103.

Further, the solid-state image sensing device 11 according to the embodiment of the present disclosure may be employed in a front side illumination type CMOS solid-state image sensing device, a CCD solid-state image sensing device, or the like, besides a backside illumination type CMOS solid-state image sensing device.

Note that the present disclosure may also employ the following configurations.

(1) A solid-state image sensing device, including:
a first photoelectric conversion element having a first semiconductor region of a first conductivity type formed inside a semiconductor substrate;
a second photoelectric conversion element having a second semiconductor region of a first conductivity type formed at a deeper position of the semiconductor substrate than the first photoelectric conversion element;
a gate electrode laminated on the semiconductor substrate and to which a predetermined voltage is applied at a charge transfer time at which a signal corresponding to charges photoelectrically converted by the first photoelectric conversion element and the second photoelectric conversion element is read;
a floating diffusion region to which the charges accumulated in the first photoelectric conversion element and the second photoelectric conversion element are transferred at the charge transfer time; and
a third semiconductor region of a first conductivity type arranged between the first semiconductor region and the second semiconductor region in a depth direction of the semiconductor substrate so as to be overlapped with the gate electrode when seen in a plan view.

(2) The solid-state image sensing device according to (1), in which
the second semiconductor region is formed so as to have a lower impurity concentration than the third semiconductor region.

(3) The solid-state image sensing device according to (1) or (2), further including:
a fourth semiconductor region of a first conductivity type formed at a deeper position than the floating diffusion region so as to be more projected to a side of the first semiconductor region than the floating diffusion region while coming in contact with the floating diffusion region.

(4) The solid-state image sensing device according to (3), in which
the fourth semiconductor region is formed so as to be overlapped with the gate electrode when seen in a plan view.

(5) The solid-state image sensing device according to any one of (1) to (4), in which
the first photoelectric conversion element has a fifth semiconductor region of a second conductivity type joined to the first semiconductor region,
the second photoelectric conversion element has a sixth semiconductor region of a second conductivity type joined to the second semiconductor region, and
a seventh semiconductor region of a second conductivity type having a lower impurity concentration than the fifth semiconductor region and the sixth semiconductor region is formed so as to come in contact with a lower side of the second semiconductor region of the second photoelectric conversion element.

The present disclosure contains subject matter related to that disclosed in Japanese Priority Patent Application JP 2011-188994 filed in the Japan Patent Office on Aug. 31, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensing device, comprising:
a first photoelectric conversion element having a first semiconductor region of a first conductivity type formed inside a semiconductor substrate;
a second photoelectric conversion element having a second semiconductor region of the first conductivity type formed at a deeper position of the semiconductor substrate than the first photoelectric conversion element;
a gate electrode laminated on the semiconductor substrate and to which a predetermined voltage is applied at a charge transfer time at which a signal corresponding to charges photoelectrically converted by the first photoelectric conversion element and the second photoelectric conversion element is read;
a floating diffusion region to which the charges accumulated in the first photoelectric conversion element and the second photoelectric conversion element are transferred at the charge transfer time, the floating diffusion region having an eighth semiconductor region of a second conductivity type formed at the shallowest position in the semiconductor substrate and having the highest impurity concentration in the solid-state image sensing device and having a ninth semiconductor region of the second conductivity type formed at a deeper position of the semiconductor substrate than the eighth semiconductor region and formed at a shallower position of the semiconductor substrate than a third semiconductor region, wherein the second conductivity type has a charge opposite to the first conductivity type; and
the third semiconductor region of the first conductivity type arranged so as to be overlapped with the ninth semiconductor region and the third semiconductor region arranged so as to be between the first semiconductor region and the second semiconductor region in a depth direction of the semiconductor substrate and so as to be overlapped with the gate electrode when seen in a plan view.

2. The solid-state image sensing device according to claim 1, wherein the second semiconductor region is formed so as to have a lower impurity concentration than the third semiconductor region.

3. The solid-state image sensing device according to claim 1, further comprising: a fourth semiconductor region of a first conductivity type formed at a deeper position than the floating diffusion region so as to be more projected to a side of the first semiconductor region than the floating diffusion region while coming in contact with the floating diffusion region.

4. The solid-state image sensing device according to claim 3, wherein the fourth semiconductor region is formed so as to be overlapped with the gate electrode when seen in a plan view.

5. The solid-state image sensing device according to claim 1, wherein the first photoelectric conversion element has a fifth semiconductor region of a second conductivity type joined to the first semiconductor region, the second photoelectric conversion element has a sixth semiconductor region of a second conductivity type joined to the second semiconductor region, and a seventh semiconductor region of a second conductivity type having a lower impurity concentration than the fifth semiconductor region and the sixth semiconductor region is formed so as to come in contact with a lower side of the second semiconductor region of the second photoelectric conversion element.

6. An electronic apparatus comprising:
  a solid-state image sensing device including a first photoelectric conversion element having a first semiconductor region of a first conductivity type formed inside a semiconductor substrate,
  a second photoelectric conversion element having a second semiconductor region of the first conductivity type formed at a deeper position of the semiconductor substrate than the first photoelectric conversion element,
  a gate electrode laminated on the semiconductor substrate and to which a predetermined voltage is applied at a charge transfer time at which a signal corresponding to charges photoelectrically converted by the first photoelectric conversion element and the second photoelectric conversion element is read,
  a floating diffusion region to which the charges accumulated in the first photoelectric conversion element and the second photoelectric conversion element are transferred at the charge transfer time, the floating diffusion region having an eighth semiconductor region of a second conductivity type formed at the shallowest position in the semiconductor substrate and having the highest impurity concentration in the solid-state image sensing device and having a ninth semiconductor region of the second conductivity type formed at a deeper position of the semiconductor substrate than the eighth semiconductor region and formed at a shallower position of the semiconductor substrate than a third semiconductor region, wherein the second conductivity type has a charge opposite to the first conductivity type, and
  the third semiconductor region of the first conductivity type arranged so as to be overlapped with the ninth semiconductor region and the third semiconductor region arranged so as to be between the first semiconductor region and the second semiconductor region in a depth direction of the semiconductor substrate and so as to be overlapped with the gate electrode when seen in a plan view.

7. A solid-state image sensing device, comprising:
  a first photoelectric conversion element having a first semiconductor region of a P-type formed inside a semiconductor substrate;
  a second photoelectric conversion element having a second semiconductor region of the P-type formed at a deeper position of the semiconductor substrate than the first photoelectric conversion element;
  a gate electrode laminated on the semiconductor substrate and to which a predetermined voltage is applied at a charge transfer time at which a signal corresponding to charges photoelectrically converted by the first photoelectric conversion element and the second photoelectric conversion element is read;
  a floating diffusion region to which the charges accumulated in the first photoelectric conversion element and the second photoelectric conversion element are transferred at the charge transfer time, the floating diffusion region having an eighth semiconductor region of a N-type formed at the shallowest position in the semiconductor substrate and having the highest impurity concentration in the solid-state image sensing device and having a ninth semiconductor region of the N-type formed at a deeper position of the semiconductor substrate than the eighth semiconductor region and formed at a shallower position of the semiconductor substrate than a third semiconductor region; and
  the third semiconductor region of the P-type arranged so as to be overlapped with the ninth semiconductor region and the third semiconductor region arranged so as to be between the first semiconductor region and the second semiconductor region in a depth direction of the semiconductor substrate and so as to be overlapped with the gate electrode when seen in a plan view.

8. The solid-state image sensing device according to claim 1, wherein the eighth conductivity type region is in a depth direction of the semiconductor substrate so as to be adjacent to the gate electrode when seen in the plan view.

9. The solid-state image sensing device according to claim 1, wherein the eighth conductivity type region is in a depth direction of the semiconductor substrate so as to be adjacent to the gate electrode when seen in a plan view and the ninth conductivity region in the depth direction of the semiconductor substrate and so as to be overlapped with the gate electrode when seen in the plan view.

\* \* \* \* \*